United States Patent
Ferreiro et al.

(10) Patent No.: US 7,990,025 B1
(45) Date of Patent: Aug. 2, 2011

(54) SILICON PACKAGE WITH EMBEDDED OSCILLATOR

(76) Inventors: Pablo Ferreiro, Erie, PA (US); Kenneth Martin, Erie, PA (US); John Cline, Erie, PA (US)

(*) Notice: Subject to any disclaimer, the term of this patent is extended or adjusted under 35 U.S.C. 154(b) by 261 days.

(21) Appl. No.: 11/698,480

(22) Filed: Jan. 25, 2007

Related U.S. Application Data

(63) Continuation-in-part of application No. 11/156,353, filed on Jun. 17, 2005, now Pat. No. 7,196,405, which is a continuation-in-part of application No. 10/931,663, filed on Sep. 1, 2004, now Pat. No. 7,061,086.

(51) Int. Cl.
*H01L 41/053* (2006.01)

(52) U.S. Cl. ........ 310/340; 310/311; 310/324; 310/341; 310/343; 257/678; 257/701; 257/704; 257/723; 257/724; 257/729; 257/E23.061; 257/E23.18; 257/E23.181

(58) Field of Classification Search .......... 257/678, 257/E23.017, 701, 704, 723, 724, 728, 729, 257/730, E23.059, E23.06, E23.061, E23.18, 257/E23.181, E23.192; 310/340, 341, 343, 310/344, 348, 353, 311, 324
See application file for complete search history.

(56) References Cited

U.S. PATENT DOCUMENTS

| | | | | |
|---|---|---|---|---|
| 3,969,640 | A * | 7/1976 | Staudte | 310/312 |
| 5,198,716 | A * | 3/1993 | Godshall et al. | 310/349 |
| 5,548,178 | A * | 8/1996 | Eda et al. | 310/349 |
| 5,919,383 | A * | 7/1999 | Beguin et al. | 219/209 |
| 6,060,692 | A * | 5/2000 | Bartley et al. | 219/210 |
| 6,507,097 | B1 * | 1/2003 | Goetz et al. | 257/678 |
| 6,806,557 | B2 * | 10/2004 | Ding | 257/659 |
| 2004/0017004 | A1 * | 1/2004 | Kasai et al. | 257/704 |
| 2004/0217673 | A1 * | 11/2004 | Unno et al. | 310/348 |
| 2005/0056917 | A1 * | 3/2005 | Kwon | 257/678 |

OTHER PUBLICATIONS

Richard C. Jaeger, Introduction to Microelectronic Fabrication, 2002, Prentice Hall, Second Edition, pp. 1 and 2.*

* cited by examiner

*Primary Examiner* — Tom Thomas
*Assistant Examiner* — Eduardo A Rodela
(74) *Attorney, Agent, or Firm* — Richard K Thomson

(57) ABSTRACT

A hermetic package for electronic components which is made of metallic silicon is disclosed. The package includes a plurality of silicon elements which are bonded together. In the first embodiment, a cavity is hollowed out in the cover to house the Application Specific Integrated Circuit oscillator and the resonator. In a second embodiment, the cavity is formed in the base member with a plurality of pedestal shelves to hold the resonator above and out of contact with the electrical circuitry for the oscillator and thermal controls.

20 Claims, 7 Drawing Sheets

SILICON PACKAGE WITH EMBEDDED OSCILLATOR

The present invention is a continuation-in-part of U.S. patent application Ser. No. 11/156,353, filed Jun. 17, 2005 now U.S. Pat. No. 7,196,405, which is a is a continuation-in-part of U.S. patent application Ser. No. 10/931,663 filed Sep. 1, 2004 now U.S. Pat. No. 7,061,086.

BACKGROUND AND SUMMARY OF THE INVENTION

The present invention is directed to the field of electronic devices, such as piezoelectric devices. The term "piezoelectric device" includes resonators, filters and surface acoustic wave devices. More particularly, the present invention is directed to a hermetic silicon package for such devices and a method of making a surface mountable electronic component utilizing such a package.

For over 50 years, the assignee of this patent application has provided piezoelectric devices such as quartz resonators, packaged in a glass housing, for use in aerospace applications. For this particular application, it is important that the piezoelectric device be housed in a vacuum chamber to prevent contamination of the quartz crystal since contaminants can cause deterioration of the accuracy of the resonator. While this deterioration is slow and typically involves changes in accuracy in the parts per billion per day range, for aerospace applications where precision accuracy is essential and the resonator needs to operate for 10-50 years on some exploratory missions, any deterioration is detrimental to the function of the resonator and, hence, to the space craft.

With the advent of solid state electronic circuitry, the number of companies manufacturing glass tubes or "bubbles" (of the type previously used for electronic vacuum tubes) has continued to dwindle, commensurate with the demand for their products. For some applications, the glass bubble can be replaced by a copper housing. However, for aerospace environment where the piezoelectric device may be exposed to temperatures exceeding 300° C., copper packages are subject to collapse as the metal reaches a softening point and the internal vacuum may draw contaminants into the cavity. This permits the piezoelectric device housed therein to be subject to whatever contaminants may be contained in the ambient environment, leading to degradation of its properties.

Within the past fifteen years, Sandia National Laboratory has performed some work on a silicon package which may be useful in housing piezoelectric elements for certain applications. This silicon package is taught in U.S. Pat. Nos. 5,198, 716 and 5,339,051. Although these patents produce some of the benefits associated with silicon for housing an electronic component, the package taught therein is wholly inadequate for use in aerospace and related applications. A low temperature bonding technique is employed. When subjected to the rigorous environment of outer space, the bond will melt (fail) leading to unacceptable degradation of the performance of the electronic package. Further, the proposed device involves silicon-quartz-silicon bonding, a difficult proposition at best, given the dissimilarity of the materials, made all the more risky by doubling the extent of circumferential area subject to failure by doubling the number of bonds needed. For many applications, this bond failure may not significantly impact the performance of the housed components but, as has been noted, in the demanding environment of aerospace, even the slightest degradation must be resisted as intolerable.

It is, therefore, the intent of this invention to provide a silicon package which can replace the glass bubble and provide the electronic components housed therein a hermetic environment which will perpetuate initial performance, or as close to initial performance as possible, for the duration of the life of the component. Another aspect of the invention is a method of manufacturing a surface mountable electronic component which is capable of such enduring peak performance.

A hermetically packaged electronic device comprising a) an enclosure made of a plurality of elements each made of a material selected from a group consisting of silicon, titanium, zirconia, silicon carbide, sapphire, and tantalum, including a base element and a cover element, the cover element having contoured edges; b) means bonding the plurality of elements together; c) an Application Specific Integrated Circuit (ASIC) oscillator embedded in the enclosure; d) a piezoelectric device secured within the enclosure; e) a metallic layer bonded to an upper surface of the lower element, the contoured edges of the cover element exposing end portions of the metallic layer to permit easy connection to electronic circuitry outside the enclosure. Preferably the material is silicon. The vacated enclosure may be filled with a gas selected from a group consisting of hydrogen, nitrogen, helium, and other inert gases.

The plurality of elements forming the enclosure is secured together by thermo-compression bonding means performed at high temperature. The base member and the cover provide means of electrical contact to the piezoelectric device obviating need for leads and wires within and protruding through a wall portion of the package. Preferably, the cover is contoured to leave portions of the heating element exposed so that electrical connection can be made thereto. The base member and the cover are each comprised of single metallic silicon crystals. The heating element comprises a non-venting, electrically conductive element bonded to an upper surface of the base member which is preferably secured to the base member by the same bonding means used to secure the plurality of enclosure elements together. The heating element is made from a material selected from the group consisting of platinum and gold, most preferably platinum so that the same element may also function as a temperature sensing means. The thermo-compression bonding means is performed in a temperature range of between 300° C. and 800° C.

Various other features, advantages and characteristics of the present invention will become apparent to one of ordinary skill in the art after a reading of the following specification.

BRIEF DESCRIPTION OF THE DRAWINGS

The preferred embodiment(s) of the present invention is/are described in conjunction with the associated drawings in which like features are indicated with like reference numerals and in which.

DETAILED DESCRIPTION OF PREFERRED EMBODIMENT(S)

Figure 1A:
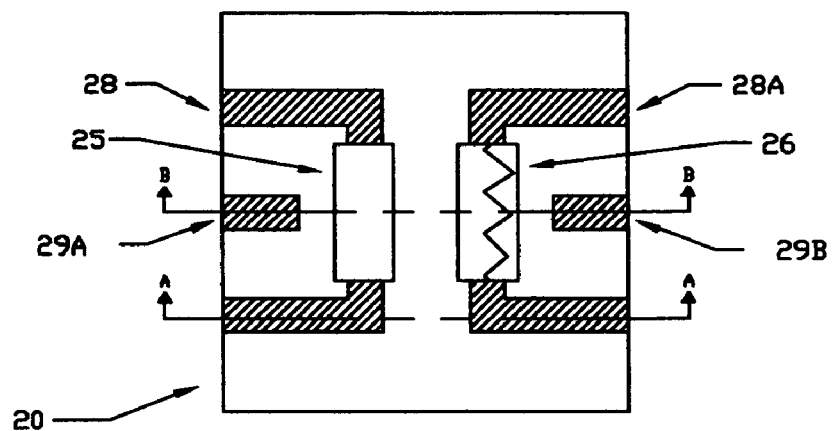
FIG. 1A is top view of a first embodiment of the silicon package of the present invention with the cover removed.
Figure 1B:
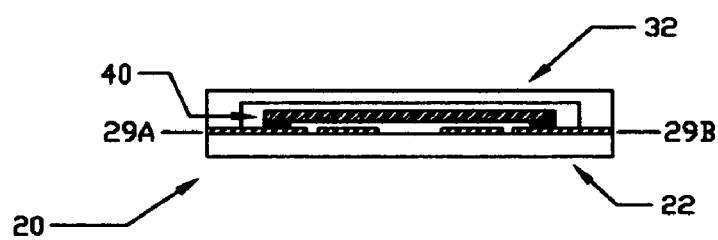
FIG. 1B is a cross-sectional view of the first embodiment as seen along line 1B-1B in FIG. 1A.
Figure 1C:
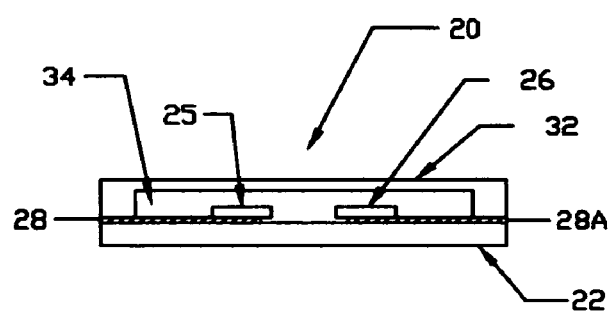
FIG. 1C is a cross-sectional view of the first embodiment as seen along line 1C-1C in FIG. 1A.

A first embodiment of a first embodiment of the silicon package incorporating an embedded Application Specific Integrated Circuit (ASIC) oscillator of the present invention is depicted in FIG. 1B generally at 20. Silicon package 20 includes a base member 22 manufactured from a single crystal of metallic silicon. The term "metallic silicon" means having zero valence. Similarly, the cover 32 is manufactured from a single crystal of metallic silicon. Cover 32 has a hollowed out region 34 to receive the piezoelectric device, in this case a quartz crystal resonator 40. As seen in FIG. 1A, base member 22 has a pair of electrodes 28, 28A which may be gold ribbon, first electrode 28 providing electrical connection to embedded ASIC oscillator circuit 25 and second electrode 28A providing electrical connection to thermal control circuit 26. Alternatively, electrodes 28, 28A may be platinum. A third circuit 29A, 29B provide electric feed through for resonator 40 which sits atop and is bonded to circuit elements 29A, 29B. The term "embedded" indicates that ASIC oscillator circuit 25 is actually etched in the silicon of base member 22 and is not a separate chip which must be bonded to the base member 22.

Figure 2A:
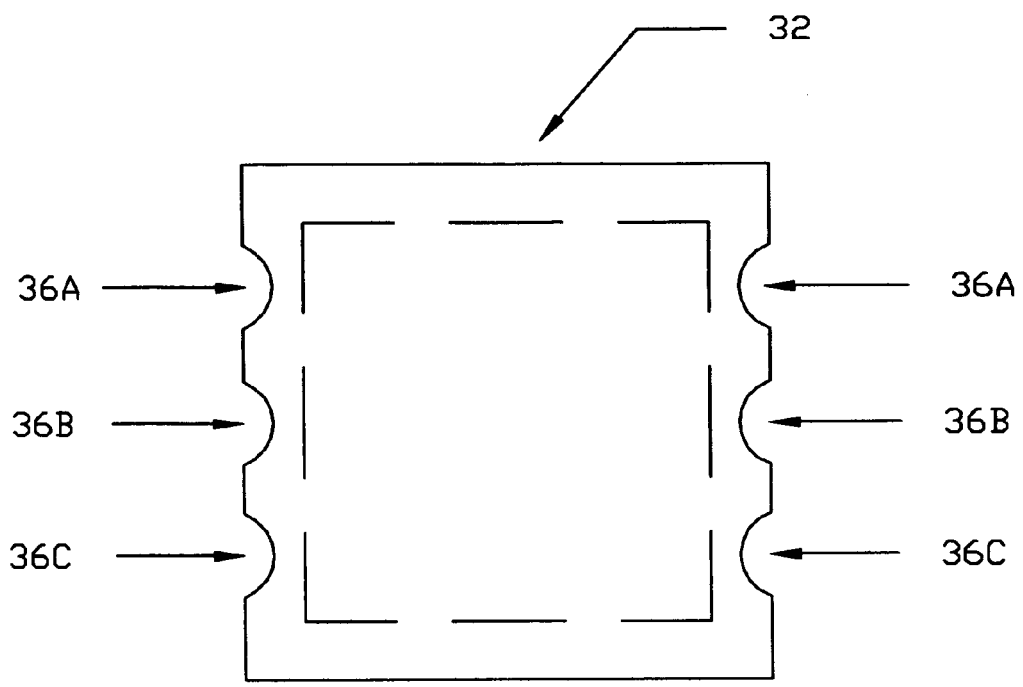
FIG. 2A is a top view of the cover of the first embodiment of the silicon package.
Figure 2B:
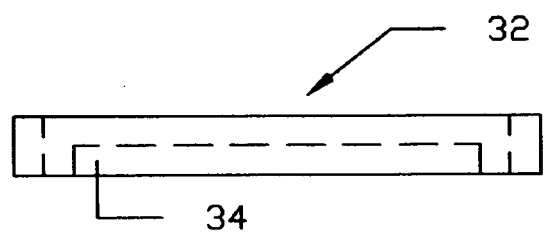
FIG. 2B is a side view of the cover of the first embodiment of the silicon package.

As best seen in FIGS. 2A-2B, cover 32 is contoured with three sets of indentations 36A, 36B, and 36C being formed on each lateral edge 35, 37, respectively. These sets of indentations 36A, 36B, and 36C overlie and, therefore, expose the end portions of electrodes 28A, 28B, 29A, and 29B to enable connection to the electrical power source external to the hermetically sealed cavity after the vacuum has been formed in a manner consistent with that described below.

Figure 6:
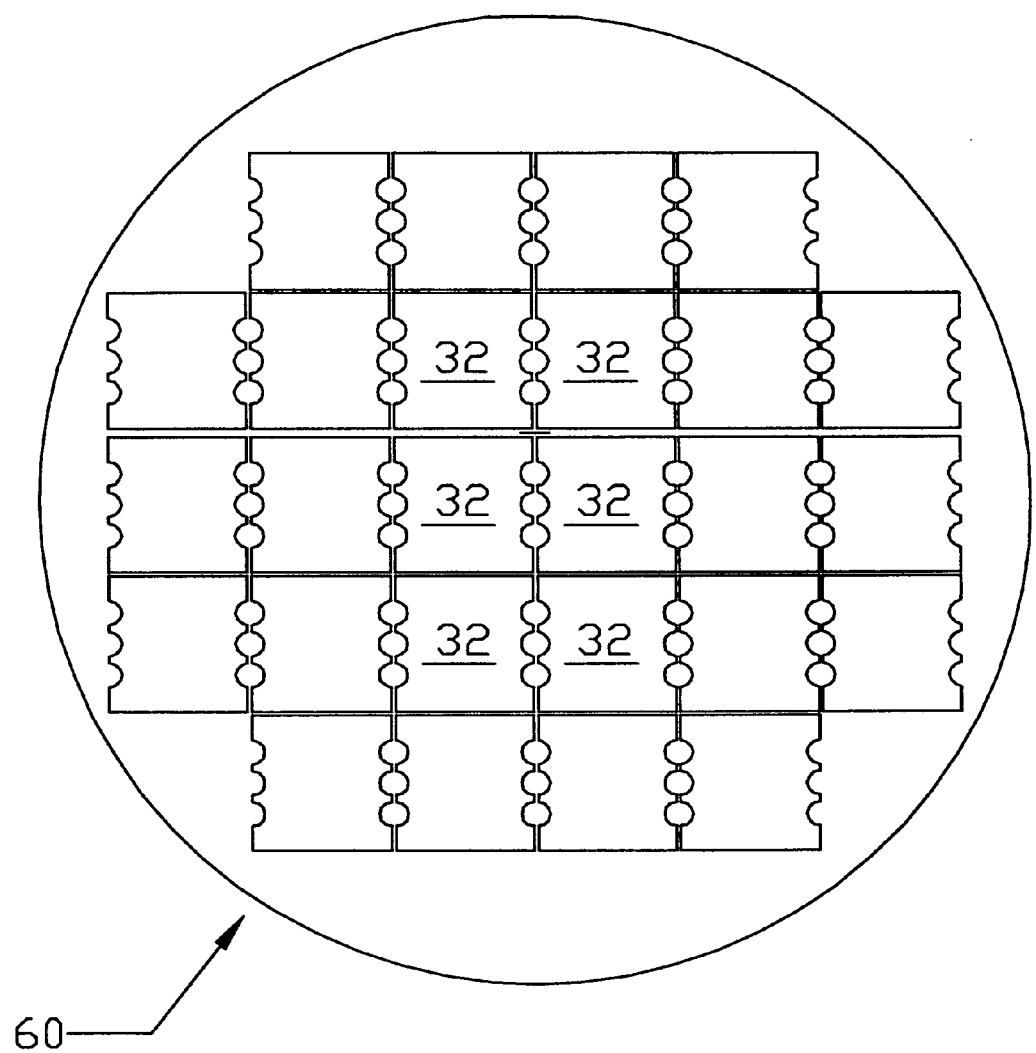
FIG. 6 is schematic depiction of a layout for forming a plurality of covers of a third embodiment.

An array 60 of covers 32 are depicted in FIG. 6. A similar array (not shown) of base members 22 is configured with electrodes 28A, 28B, 29A, and 29B in place. Quartz crystal resonator 40 is attached to base member 22 by any of a variety of known high temperature methods performed in a temperature range from 300° C. and 800° C., a brazing technique using a gold indium eutectic alloy performed at a temperature of 495° C. being preferred. The same technique is then employed to attach silicon to silicon as each cover 32 in array 60 is attached to each base member 22 within a vacuum chamber capable of pulling a vacuum in the range of between $1\times10^{-6}$ and $1\times10^{-10}$ torr to remove all potential pollutants from the cavity created by the hollowed out portion 34 as well as from the elements mounted therein. It will be understood that should a technological advance be made in the area of vacuum equipment where a vacuum of $1\times10^{-11}$ torr or less would be possible, such a vacuum would also not depart from the scope of this invention. Once covers 32 in array 60 is attached to the arrayed base members 22, the miniaturized hermetically sealed chambers are separated from each other.

Figure 3A:
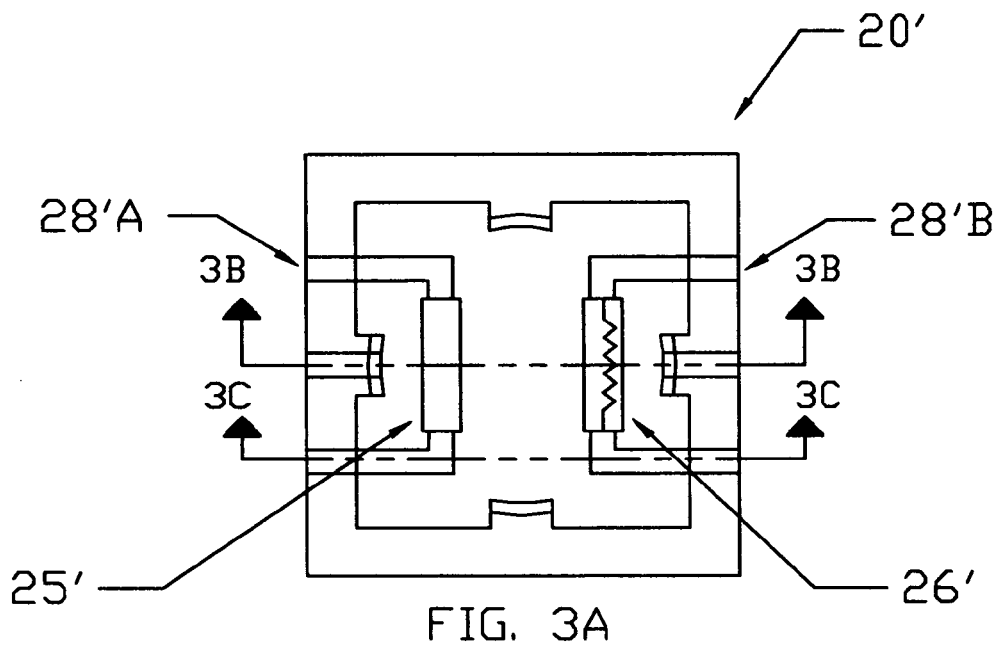
FIG. 3A is a top view of a second embodiment of the silicon package of the present invention with the cover removed.
Figure 3B:
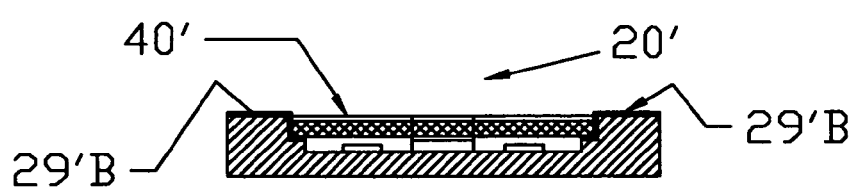
FIG. 3B is a cross-sectional side view of the base member of the second embodiment as seen along line 3B-3B of FIG. 3A.
Figure 3C:
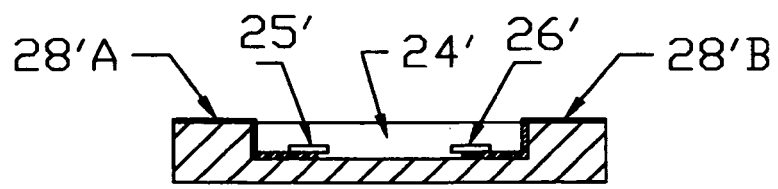
FIG. 3C is a cross-sectional side view of the base member of the second embodiment as seen along line 3C-3C of FIG. 3A.
Figure 4A:
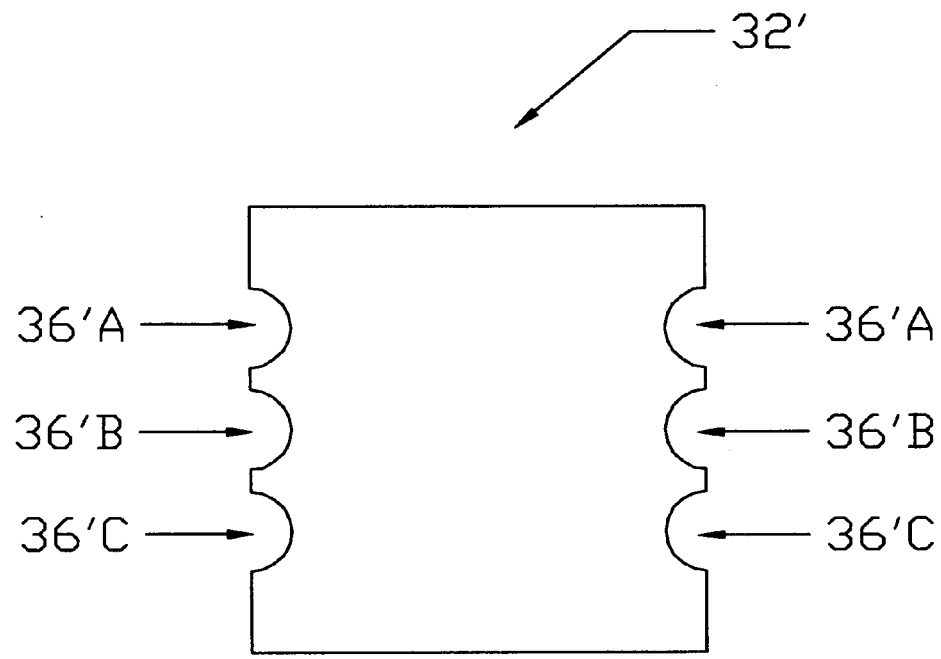
FIG. 4A is a top view of a second embodiment of the cover of the present invention.
Figure 4B:
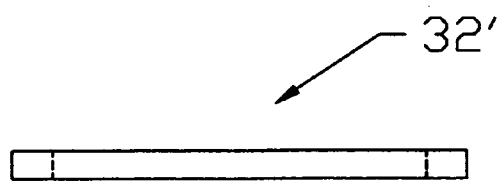
FIG. 4B is a side view of the cover for the second embodiment.

A second embodiment of the surface mountable electronic component including a hermetic package is shown in FIGS. 3A-3C generally at 20'. In this embodiment, the base member 22' has a hollowed out region 24'. The hollowed out region is provided with shoulders 21' which can support the resonator 40' above and in non-contacting relationship to the ASIC oscillator circuit 25' and the thermal control circuit 26'. In the formation of the single crystal of metallic silicon forming base member 22' and cover 32', the p-doping process renders the silicon non-conductive. The ends of the electronic circuits 28'A, 28'B, 29'A and 29'B extend up on the rim 23' of the hollowed out region 24'. As with the previous embodiment, the cover 32', which is, in this case, flat, is contoured defining indentations 36'A, 36'B, 36'C overlie and expose the ends of electronic circuits 28'A, 28'B, 29'A and 29'B to enable attachment to the electronic power source external to the hermetically sealed container 20' after its formation.

While both the first and second embodiments have been described as having base members and covers made of single crystal silicon brazed using gold indium eutectic alloy, it is contemplated that other materials could be used. For example, while silicon is the preferred material, other materials including titanium, zirconia, silicon carbide, sapphire, and tantalum could be used. Similarly, while the brazing technique set forth herein is preferred method of affixing the two halves of the package together as well as fixing the electronic component in place, it is contemplated other bonding techniques including laser welding, E-beam welding, anodic bonding, and induction heating could be used. Finally, although the preferred electronic component is an ultra-stable oscillator in the form of a quartz crystal, it is envisioned that other electronic components including a gallium orthophosphate crystal and a lithium niobate crystal, could be utilized in this hermetic package.

Figure 5A:
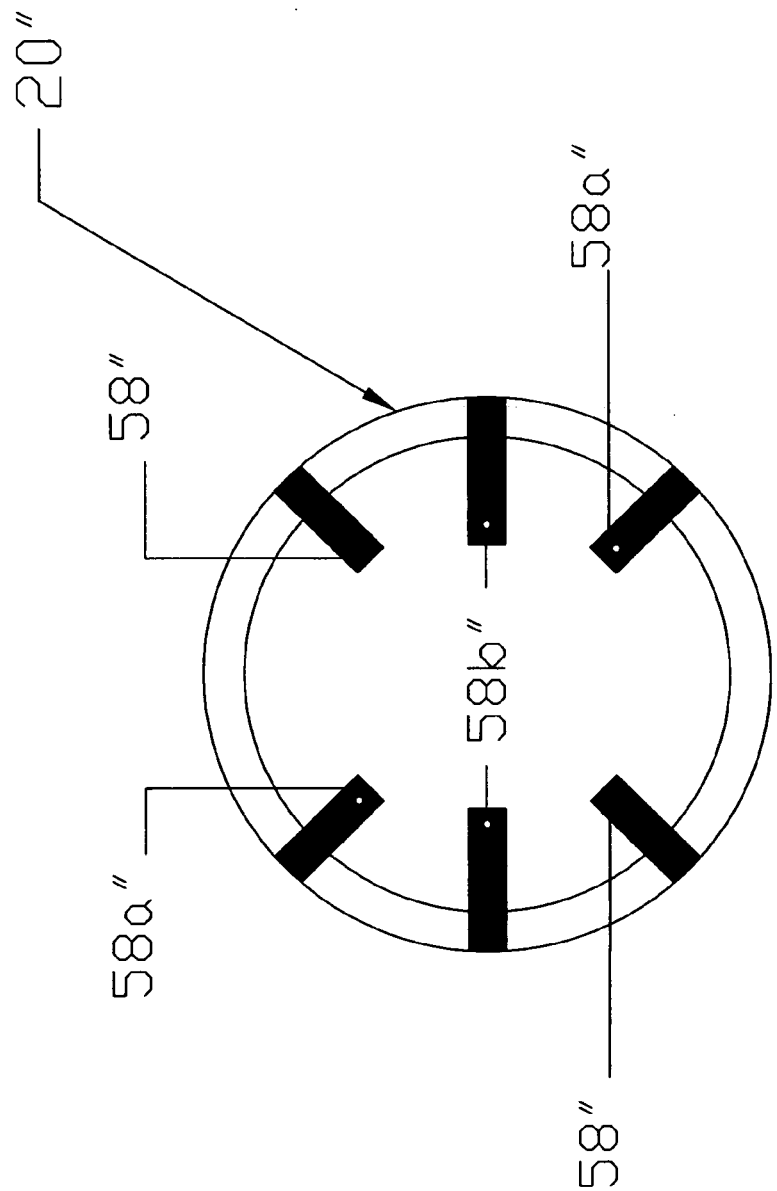
FIG. 5A is a cross-sectional bottom view taken along line 5-5 in FIG. 5B.
Figure 5B:
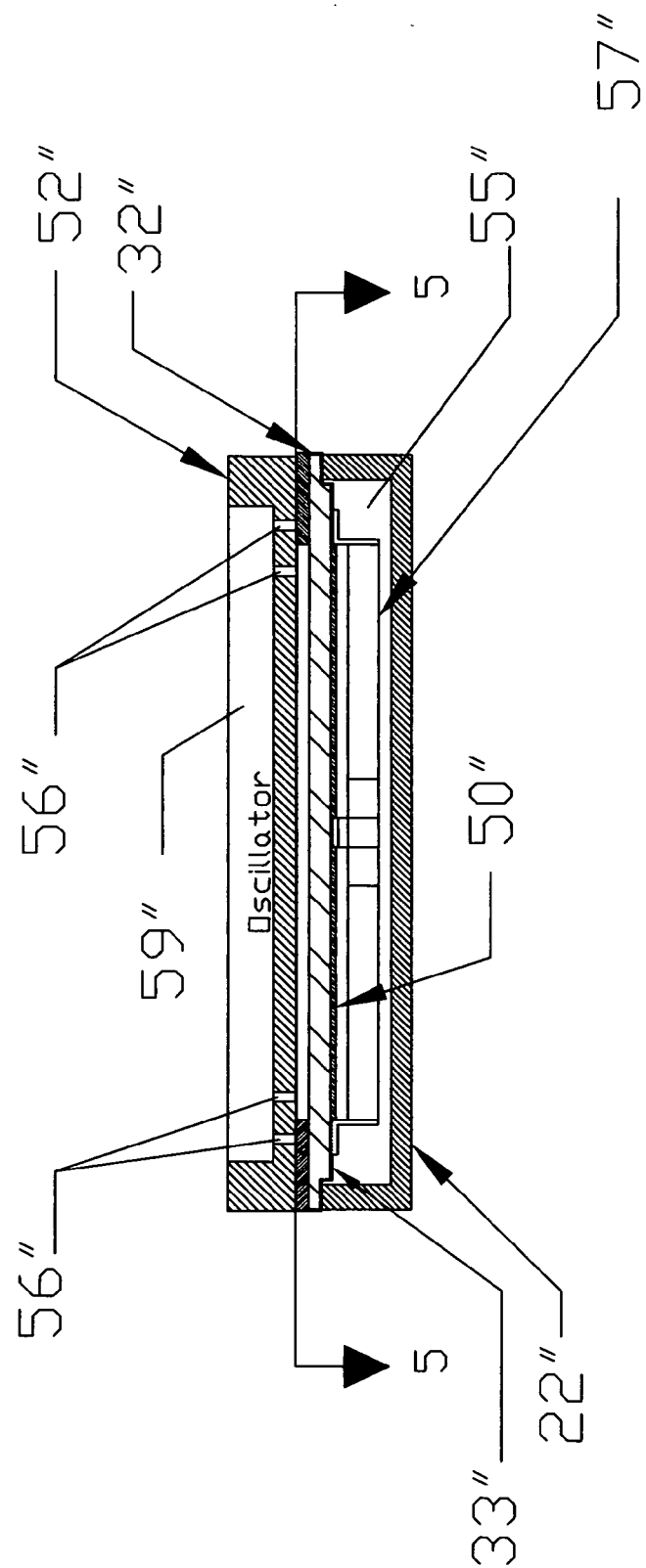
FIG. 5B is a cross-sectional side view of the cover depicted in FIG. 5A.

A third embodiment is shown in FIGS. 5A and 5B generally at 20". In this embodiment, three single crystal metallic silicon elements 22", 32" and 52" are bonded together using the techniques described with respect to the first and second embodiments. A metallic layer 50" is bonded to the lower surface 33" of cover 32" within the hermetically sealed chamber 55". Material for metallic layer 50" will be selected from a group consisting of gold and platinum. Both of these metals are suitable for use as heaters for chamber 55" by running a large current there through. An added benefit of a platinum metallic layer 50" is that platinum can double as a thermal sensor within chamber 55"by subjecting it to a lower amperage current. Cradle 52" provides space for mounting oscillator 59" and electrical controls external to the hermetic chamber 55".

The electronic component or device 57" may be a piezoelectric component such as a quartz crystal or may take another form. As shown in FIG. 5B, oscillator 59" and associated electrical control elements are mounted external to the hermetically sealed chamber 55" and electrical contacts 56" extend through element 52" to make connection with silicon element 32". Ribbons 58" are wrapped around to the upper surface of cover 32" (FIG. 5a) with ribbons 58a" providing electrical connection for heating/sensing element 50", ribbons 58b" providing electrical connection for electrical device 57" and the remaining ribbons 58" provided for another component which may be mounted within chamber 55".

It will be understood that once a vacuum has been applied to chamber 55", for some applications, it may be beneficial to fill chamber 55" with helium, hydrogen, nitrogen or an inert gas. The presence of the gas can facilitate the heating of the elements within the chamber to a uniform temperature.

Various other changes, alternatives and modifications will become apparent to one of ordinary skill in the art following a reading of the foregoing specification. It is intended that any such changes, alternatives and modifications as fall within the scope of the appended claims be considered part of the present invention.

We claim:

1. A hermetically packaged electronic device comprising
   a) an enclosure made of a plurality of elements, a base element made of a first material selected from a group consisting of silicon, titanium, zirconia, silicon carbide, sapphire, and tantalum, and a cover element made of the same said first material, said cover element having contoured edges creating recessed areas extending inwardly from a straight portion of said edges, at least one of said cover and said base element having a hollowed out region for receiving an electrical device;
   b) means bonding said plurality of elements together to form a hermetically sealed enclosure;
   c) an Application Specific Integrated Circuit (ASIC) etched into one of said plurality of elements forming said enclosure, said ASIC being etched on a surface internal to said enclosure;
   d) a piezoelectric device secured within said enclosure;
   e) a metallic layer bonded to a surface of one of said elements forming said enclosure, said contoured edges of said cover element exposing end portions of said metallic layer to permit easy connection to electronic circuitry outside said enclosure.

2. The device of claim 1 wherein said first material is silicon.

3. The device of claim 1 wherein said enclosure is filled with a gas selected from a group consisting of hydrogen, nitrogen, helium, and other inert gases.

4. The device of claim 1 further comprising thermo-compression bonding means performed at high temperature for securing said plurality of elements of said enclosure directly to each other.

5. The device of claim 4 wherein said plurality of elements include a base member and a cover configured to fit thereon which additionally house a heating element.

6. The package of claim 5 wherein said base member and said cover provide means of electrical contact to said piezoelectric device obviating need for leads and wires within and protruding through a wall portion of said package.

7. The device of claim 6 wherein said cover is contoured to leave portions of said heating element exposed so that electrical connection can be made thereto.

8. The device of claim 5 wherein said base member and said cover are each comprised of single metallic silicon zero valence crystals.

9. The device of claim 5 wherein said heating element comprises a non-venting, electrically conductive element bonded to an upper surface of said base member.

10. The device of claim 9 wherein said heating element is secured to said base member by the same bonding means used to secure said plurality of enclosure elements together.

11. The device of claim 9 wherein said heating element is made from a material selected from the group consisting of pure platinum and pure gold.

12. The device of claim 11 wherein said heating element is made from platinum and also serves as said temperature sensing means.

13. The package of claim 4 wherein said thermo-compression bonding means is performed in a temperature range of between 300° C. and 800° C.

14. The device of claim 1 wherein said metallic layer is selected from the group consisting of pure platinum and pure gold.

15. The device of claim 14 wherein said metallic layer is pure platinum.

16. The device of claim 15 wherein said metallic layer serves as both a heating element and a thermal sensor.

17. A hermetically packaged electronic device comprising
   a) an enclosure made of a plurality of elements, a base element made of a first material selected from a group consisting of silicon, titanium, zirconia, silicon carbide, sapphire, and tantalum, and a cover element made of the same said first material, said cover element having contoured edges creating recessed areas extending inwardly from a straight portion of said edges, at least one of said cover and said base element having a hollowed out region for receiving an electrical device;
   b) means bonding said base element and said cover element together to form a hermetically sealed enclosure;
   c) a third cradle element having a hollowed out region for receiving an oscillator external to said hermetic enclosure, said third cradle element being bonded to an upper surface of said cover element with said hollowed out region extending upwardly;
   d) a piezoelectric device secured within said enclosure;
   e) a metallic ribbon layer bonded to said lower surface of said cover element, said metallic ribbon being wrapped around edge portions of said cover element to enable electrical connection to elements outside said enclosure;
   f) a plurality of electrical contacts extending through said third cradle element to effect said electrical connection.

18. The device of claim 17 further comprising thermo-compression bonding means performed in a temperature range of between 300° C. and 800° C. for securing said plurality of elements of said enclosure directly to each other.

19. The device of claim 17 wherein said metallic layer is platinum and serves as both a heating element and a thermal sensor.

20. The device of claim 17 wherein each of said base, said cover and said third cradle element are comprised of single metallic silicon zero valence crystals.

* * * * *